United States Patent
Ide

(10) Patent No.: US 8,022,658 B2
(45) Date of Patent: Sep. 20, 2011

(54) MOTOR CONTROL SYSTEM INCLUDING ELECTRICAL INSULATION DETERIORATION DETECTING SYSTEM

(75) Inventor: Yuji Ide, Tokyo (JP)

(73) Assignee: Sanyo Denki Co., Ltd., Tokyo (JP)

( * ) Notice: Subject to any disclaimer, the term of this patent is extended or adjusted under 35 U.S.C. 154(b) by 445 days.

(21) Appl. No.: 12/363,885

(22) Filed: Feb. 2, 2009

(65) Prior Publication Data
US 2009/0195205 A1 Aug. 6, 2009

(30) Foreign Application Priority Data

Feb. 1, 2008 (JP) .................................. 2008-023267
Jul. 24, 2008 (JP) .................................. 2008-191211

(51) Int. Cl.
*H02P 27/04* (2006.01)
(52) U.S. Cl. ............. 318/802; 363/35; 363/40; 363/141
(58) Field of Classification Search ................... 318/802
See application file for complete search history.

(56) References Cited

U.S. PATENT DOCUMENTS

| 2004/0257029 A1* | 12/2004 | Sakamoto et al. | 318/802 |
| 2005/0068000 A1* | 3/2005 | Yamada et al. | 318/802 |
| 2005/0151658 A1 | 7/2005 | Kono et al. | |
| 2008/0094022 A1* | 4/2008 | Horikoshi et al. | 318/802 |

FOREIGN PATENT DOCUMENTS

JP 06-094762 4/1994

* cited by examiner

*Primary Examiner* — Walter Benson
*Assistant Examiner* — Jorge Carrasquillo
(74) *Attorney, Agent, or Firm* — Rankin, Hill & Clark LLP

(57) ABSTRACT

A motor control system of the present invention includes an accurate electrical insulation deterioration detecting system. A voltage divider circuit is arranged between a negative DC output portion and a ground, through a normally open switch circuit. A detecting operation control section closes the normally open switch while a circuit breaker is opened, and places at least one of transistors electrically connected to a positive DC output portion into a conductive state, from among six transistors included in three arm circuits. A voltage across the first resistor is inputted as a divided voltage into a voltage comparator of a voltage comparison section. The voltage comparison section compares a divided voltage outputted from the voltage divider circuit and a reference voltage using the voltage comparator and outputs an alarm signal if the divided voltage exceeds the reference voltage.

10 Claims, 3 Drawing Sheets

MOTOR CONTROL SYSTEM INCLUDING ELECTRICAL INSULATION DETERIORATION DETECTING SYSTEM

BACKFIELD OF THE INVENTION

The present invention relates to a motor control system including an electrical insulation deterioration detecting system which detects the electrical insulation deterioration (an unusual decrease of electrical insulation resistance) of a motor and a method of detecting the electrical insulation deterioration of the motor.

BACKGROUND OF THE INVENTION

Various kinds of motors, such as a servo motor used with a machine tool etc., are driven by a motor control system including a PWM controlled inverter circuit. If the machine tool uses a cutting fluid, the motor may get wet with the cutting fluid and the cutting water may enter the motor. The electrical insulation of the motor may accordingly be deteriorated. The electrical insulation deterioration of the motor is progressing gradually and finally results in a ground fault. The ground fault of motor may cause an earth leakage circuit to trip and damage the motor control system, which may result in a failure of a system using the motor. The system failure exerts great influence on the production line of a factory. Accordingly, from the viewpoint of preventive maintenance, a system, which is capable of detecting the electrical insulation deterioration of motors, is needed.

Examples of conventional methods of detecting the electrical insulation deterioration of motor are as follows:

(1) To use an electrical insulation resistance meter;

(2) To use a leakage current detector;

(3) To insert a series circuit formed by a capacitor and a resistance between a ground and one of a pair of direct current (hereinafter referred to as DC) input portions or between positive and negative input portions of a PWM controlled inverter circuit, and dispose a detection circuit that detects the potential difference between both ends of the resistance in the series circuit, so that the electrical insulation deterioration of a motor can be detected without stopping the motor, as disclosed in Japanese Patent Application Publication No. 2005-201669 or JP2005-201669A;

(4) To ground a DC input portion of a PWM controlled inverter circuit, apply a direct current voltage across an inverter system to a motor through a semiconductor device included in the inverter circuit, and detect an electrical insulation resistance of the motor by measuring the direct current voltage and the direct current of the inverter system, as disclosed in Japanese Patent Application Publication No. 1994-94762 or JP1994-94762A; and (5) To determine electrical insulation deterioration by using a charged voltage across a smoothing capacitor when all of a plurality of semiconductor switch devices constituting an inverter circuit are in a non-conductive state, as disclosed in Japanese Patent Application Publication No. 2005-16958 and Japanese Patent Application Publication No. 2005-110400 [JP2005-16958A and JP1005-110400A].

In these publicly known methods, the charged voltage across the smoothing capacitor is applied to a motor through a switch provided separately from the semiconductor switches constituting the inverter circuit.

In the above-mentioned method (1) which uses the electrical insulation resistance meter, the deterioration of electrical insulation is detected based on the value of electrical insulation resistance measured by connecting the electrical insulation resistance meter between a winding of the motor and a ground to measure the value of electrical insulation resistance with electric wiring between a motor and a motor control system being removed. However, this method requires many man-hours for removing wiring of the motor.

In the above-mentioned method (2) which uses the leakage current detector, the electrical insulation deterioration of a motor on a detected value obtained by the leakage current detector disposed between the power supply inputs of a motor control system. However, in the motor control system including the PWM controlled inverter circuit, since leakage current flows through the power supply due to a switching operation of semiconductor devices included in the inverter circuit, it is difficult to properly detect the electrical insulation deterioration of the motor.

In the above-mentioned method (3), since current flowing through the detection circuit is affected by a leakage current flowing through a power supply or flowing through stray capacitances of a motor and a wiring cable, a detection error is likely to occur in detecting the electrical insulation deterioration.

In the above-mentioned method (4), a direct-current input portion of the inverter circuit is grounded and the direct current voltage applied to the inverter device is applied to the motor through the semiconductor devices included in the inverter system. Then, the electrical insulation resistance of the motor is detected by measuring the DC input voltage and DC input current of the inverter circuit at that time. In this method, however, if the electrical insulation of the motor is deteriorated and the ground fault has occurred, the direct current voltage of the inverter circuit may be short-circuited when the semiconductor devices included in the inverter circuit are in a conductive state. As a result, the semiconductor devices may be damaged. A small current flows into a detector for measuring a direct current when detecting the electrical insulation deterioration while a large current flows at the time of usual motor control. Accordingly, the current detector is required not only to tolerate high current but also to be capable of detecting very small current with sufficient accuracy. However, an ordinary current detector cannot obtain such high detecting accuracy, and it is difficult to increase the detecting accuracy of an ordinary current detector.

In the above-mentioned method (5) of the electrical insulation deterioration determination as disclosed in JP2005-16958A and JP2005-110400A, since the charged voltage across the smoothing capacitor is applied to the motor through a switch provided separately from the semiconductor switches constituting the inverter circuit, the number of components is inevitably increased. Further, it is difficult o know the cause of the electrical insulation deterioration of a motor by the conventional methods.

SUMMARY OF THE INVENTION

It is an object of the present invention to provide a motor control system which is not affected by leakage current caused by a switching operation of an inverter circuit, and is capable of preventing semiconductor switches included in the inverter circuits from being damaged even if a motor is ground faulted, and furthermore includes an accurate electrical insulation deterioration detecting system.

It is another object of the present invention to provide a method of detecting electrical insulation deterioration of a motor with high accuracy without being affected by leakage current due to a switching operation of an inverter circuit and without damaging the semiconductor switches included in the inverter circuits even if the motor is ground faulted.

It is a further object of the present invention to provide a motor control system including an electrical insulation deterioration detecting system by which the cause of the electrical insulation deterioration of a motor can be known, and a method of detecting the electrical insulation deterioration of the motor.

A motor control system of the present invention comprises a rectifier circuit, an inverter circuit, and an electrical insulation deterioration detecting system. The rectifier circuit is connected to an AC power supply through a circuit breaker and includes a positive DC output portion, a negative DC output portion, and a smoothing capacitor connected across the positive DC output portion and the negative DC output portion. The inverter circuit is constituted from a plurality of arm circuits connected in parallel. Each arm circuit includes a pair of semiconductor switches connected in series and has an AC output portion at a connection point of the pair of semiconductor switches. The electrical insulation deterioration detecting system detects deterioration in electrical insulation resistance of a motor driven by the inverter circuit.

In the present invention, the electrical insulation deterioration detecting system comprises a voltage divider circuit, a detecting operation control section, and a voltage comparison section. In the most basic configuration of the electrical insulation deterioration detecting system, the voltage divider circuit is arranged between one of the positive DC output portion and the negative DC output portion and a ground, through a normally open switch circuit. The detecting operation control section closes the normally open switch circuit and causes at least one of the semiconductor switches, which are included in the plurality of arm circuits and electrically connected to the other of the positive DC output portion and the negative DC output portion, to be in a conductive state, while the circuit breaker is opened. The voltage comparison section compares a divided voltage outputted from the voltage divider circuit and a reference voltage to determine if the divided voltage exceeds the reference voltage, and outputs an alarm signal indicating a possibility of occurrence of deterioration in the electrical insulation resistance if the divided voltage exceeds the reference voltage.

In the present invention, the electrical insulation deterioration detecting system is operated when the circuit breaker arranged between the power supply and the rectifier circuit is opened or turned off. Accordingly, a decrease of detecting accuracy, which is caused by a leakage current flowing through the power supply upon detecting the electrical insulation deterioration, can be prevented. Further, the detection can be carried out without being affected by noise of the power supply. In the present invention, since the voltage divider circuit is separated from the inverter circuit at the time of usual operation of the inverter circuit because of the presence of the normally open switch circuit, the voltage divider circuit does not affect the operation of the inverter circuit. Since the voltage divider circuit serves as a resistance load against the motor and the smoothing capacitor upon detecting the electrical insulation deterioration, overcurrent does not flow rapidly from the smoothing capacitor through the semiconductor switch in a conductive state even if the motor is ground faulted. Accordingly, the semiconductor switch included in the inverter circuit can be prevented from being damaged even if the motor is ground faulted. Upon detection, since the electrical insulation deterioration is detected by applying a direct current through circuit including the semiconductor switches using the smoothing capacitor as an operation power for detection, electrical insulation deterioration can be detected with high precision without being affected by stray capacitance of the motor and wiring cable. In particular in the present invention, since some of the semiconductor switches included in the inverter circuit is placed into a conductive state for detecting the electrical insulation deterioration, the number of components required for detection, such as a switch, can be reduced. Since electric charge in the smoothing capacitor is discharged through a circuit including excitation windings in which excitation currents of the motor flow, the detection result of electrical insulation deterioration of the motor is influenced by the condition of electrical insulation deterioration of the excitation windings.

A control source, which is necessary for operating the electrical insulation deterioration detecting system, may be provided separately from the power supply to which the circuit breaker is connected, or it is also possible to provide and use a power supply circuit connected to the above-mentioned power supply without passing through the circuit breaker.

Although in the above-mentioned basic configuration it is possible to detect the electrical insulation deterioration, it is impossible to detect the direct cause of the electrical insulation deterioration only with such configuration. To further detect the direct cause of the electrical insulation deterioration, the detecting operation control section may be configured to cause the semiconductor switches electrically connected to the other of the positive DC output portion and the negative DC output portion to be in a conductive state or place them into a conductive state one by one in a predetermined sequence. With such configuration, when it is determined by the voltage comparison section that the divided voltage exceeds the reference voltage and an alarm signal is outputted, the alarm signal can indicate not only a possibility of occurrence of deterioration in the electrical insulation resistance of the motor but also a possibility of occurrence of electrical insulation deterioration in the excitation winding of the motor to which the semiconductor switch in the conductive state is connected. When the semiconductor switches are placed into the conductive state one by one sequentially, an alarm signal is outputted whenever any of the semiconductor switches is placed into the conductive state if the electrical insulation resistance of the motor is considerably decreased. If the electrical insulation resistance of the motor is not decreased and a voltage is applied to an excitation winding whose electrical insulation is not deteriorated, the alarm signal is not outputted. Accordingly, if an alarm signal is outputted only when a certain semiconductor switch is caused in a conductive state or placed into a conductive state and if no alarm signal is outputted when other semiconductor switches are placed into the conductive state, it is possible to identify in which excitation winding electrical insulation is deteriorated by identifying which semiconductor switch is in the conductive state, thereby confirming one of the causes of the electrical insulation deterioration in the motor. The sequence of the semiconductor switches to be placed into the conductive state may be determined arbitrarily. One semiconductor switch may be placed into the conductive state in one measurement operation and another semiconductor switch may be placed into the conductive state in the next operation. Alternatively, all the semiconductor switches, which must be placed into the conductive state, may be caused to be in the conductive state one by one sequentially in one measurement operation.

The voltage divider circuit may comprise a first resistor having one end and the other end and a second resistor having one end and the other end. The one end of the first resistor is electrically connected to the negative DC output portion while the one end of the second resistor is electrically connected to the ground. The other end of the first resistor and the other end of the second resistor are electrically connected to each other. In this manner, it is preferred that a voltage across the first resistor is inputted to the voltage comparison section as the divided voltage, and the second resistor serves as a protective resistance that prevents an occurrence of overcurrent when the motor is ground faulted. With such configuration, an occurrence of overcurrent can be prevented with certainty even when the motor is ground faulted.

It is desirable to arrange a normally open switch circuit between the other end of the first resistor and the other end of the second resistor. Alternatively, the normally open switch circuit may be arranged between the second resistor and the ground.

The method of detecting electrical insulation deterioration of a motor according to the present invention is described below. Basically, a circuit breaker is opened. Then, a voltage divider circuit is electrically connected between one of the positive DC output portion and the negative DC output portion and a ground. Then at least one of the semiconductor switches included in the plurality of arm circuits and electrically connected to the other of the positive DC output portion and the negative DC output portion is caused in a conductive state or placed into a conductive state to apply a voltage across the smoothing capacitor to a series circuit that is formed by the semiconductor switch in the conductive state, an excitation winding of the motor, the electrical insulation resistance of the motor and the voltage divider circuit. Then an occurrence of deterioration in the electrical insulation resistance is detected based on whether or not a divided voltage outputted from the voltage divider circuit exceeds a reference voltage. To further detect the cause of the electrical insulation deterioration, the plurality of semiconductor switches are placed into the conductive state one by one in a predetermined sequence, and a possibility of occurrence of deterioration in the electrical insulation resistance of the motor and a possibility of occurrence of electrical insulation deterioration in the excitation winding of the motor to which the semiconductor switch in the conductive state is connected are detected, based on whether or not the divided voltage exceeds the reference voltage whenever any of the plurality of semiconductor switches is placed into the conductive state or only when a specific semiconductor switch is placed put into the conductive state.

When a plurality of motors are driven by a plurality of inverter circuits, one inverter circuit is selected from among the plurality of inverter circuits, and at least one of the semiconductor switches included in the plurality of arm circuits in the selected inverter circuit and electrically connected to the other of the positive DC output portion and the negative DC output portion is placed into the conductive state to apply a voltage across the smoothing capacitor to a series circuit that is formed by the semiconductor switch in the conductive state, an excitation winding of the motor, the electrical insulation resistance of the motor, and the voltage divider circuit.

When driving a plurality of motors by a plurality of inverter circuits, it is also possible to detect the cause of the electrical insulation deterioration. For example, if m (m is a positive integer of two or more) motors are driven by m inverter circuits, the motor control system is configured as follows. A detecting operation control section closes the normally open switch circuit while the circuit breaker is opened, and sequentially selects n (n is a positive integer from one to less than m) inverter circuits to be detected from among the m inverter circuits, and places the semiconductor switches, which are included in the plurality of arm circuits included in the selected n inverter circuits and electrically connected to the other of the positive DC output portion and the negative DC output portion, into a conductive state one by one in a predetermined sequence, while the circuit breaker is opened. A voltage comparison section compares a divided voltage outputted from the voltage divider circuit and a reference voltage to determine that the divided voltage exceeds the reference voltage, and outputs an alarm signal. Thus a possibility of occurrence of deterioration in the electrical insulation resistance of any of the n motors driven by the selected n inverter circuits, and/or a possibility of an occurrence of electrical insulation deterioration in an excitation winding of the motor to which the semiconductor switch in the conductive state is connected (the cause is here, in the excitation winding), can be detected based on the outputted alarm signal.

For example, if four motors are driven by four inverter circuits, the four inverter circuits are divided into two groups each consisting of two inverter circuits, so that inverter circuits may be selected two by two as a first group and a second group. Then, a plurality of semiconductor switches included in the selected two inverter circuits (the first group) and electrically connected to the other of the positive DC output portion and the negative electrode DC output portion is placed into the conductive state one by one in a predetermined sequence. If the same conduction control is given to both of the selected two inverter circuits at a time, the conduction control of semiconductor switches included in the respective inverter circuits is more simplified. However, the timing of the conduction control applied to the semiconductor switches in the two inverter circuits may be different between the two inverter circuits. Subsequently, the other two inverter circuits belonging to the second group are selected. A plurality of semiconductor switches included in the other two inverter circuits and electrically connected to the other of the positive DC output portion and the negative DC output portion are placed into the conductive state in a predetermined sequence. With such configuration, the electrical insulation deterioration of motors can be detected sequentially by dealing with the selected n inverter circuits as one group. If the number of the inverter circuits to be selected at a time (i.e., n) is constant, the subsequent conduction control of semiconductor switches can be carried out by repeatedly using the same control circuit.

When the inverter circuits installed in the motor control system is not divided by equal numbers, for example by five, the value of n may be variable instead of a constant number. For example, n may be defined as three for the first group so that detecting operation may be performed for three inverter circuits belonging to the first group. Subsequently, n may be defined as two for the second group so that detecting operation may be performed for two inverter circuits belonging to the second group.

In consideration of a possible failure of motors, it is preferred that n is defined as one so that the inverter circuits may be selected one by one at a time and the semiconductor switches included in the selected inverter circuit may be placed into the conductive state in a predetermined sequence. In this manner, the presence of motor failure is recognized clearly and it becomes possible to promptly identify which motor suffers from electrical insulation deterioration.

As mentioned above, when the plurality of semiconductor switches included in one inverter circuit are placed into a conductive state one by one in a predetermined sequence to detect the deterioration state of each excitation winding, it is preferred that the electrical insulation deterioration detecting system further comprises a comparison result storage section that stores a comparison result obtained by the voltage comparison section. With such comparison result storage section, it becomes possible not only to know a possibility of occurrence of electrical insulation deterioration in the motor and a possibility of occurrence of the electrical insulation deterioration in a specific excitation winding but also to know a progress of the electrical insulation deterioration, based on the historical data on the past comparison results. In this situation, two or more kinds of different values for the reference voltage may be defined so that it can be stored in the comparison result storage section whether or not the divided voltage reaches the two or more kinds of reference voltages. With such two or more kinds of reference voltages prepared, it becomes possible to previously indicate a possibility of occurrence of the electrical insulation deterioration in a motor before the electrical insulation deterioration has progressed to a final stage.

According to the present invention, since the electrical insulation deterioration detecting system is operable when the circuit breaker arranged between the power supply and the rectifier circuit is opened or turned off, it can prevent a decrease of detecting accuracy due to a leakage current flowing through the power supply upon detecting the electrical insulation deterioration. Further, the detection can be carried out without being affected by noise of the power supply.

In the present invention, since the voltage divider circuit is separated from the inverter circuit at the time of the usual operation of the inverter circuit because of the presence of the normally open switch circuit, the voltage divider circuit does not affect the operation of the inverter circuit.

Since the voltage divider circuit serves as a resistance load against the motor and the smoothing capacitor upon detecting the electrical insulation deterioration, overcurrent does not flow from the smoothing capacitor during a short time period trough the semiconductor switch in conductive state, even when the motor is ground faulted. Accordingly, the semiconductor switch included in the inverter circuit can be prevented from being damaged even when the motor is ground faulted.

Upon detection, since the electrical insulation deterioration is detected by applying a direct current to a circuit including the semiconductor switches with the use of the smoothing capacitor as an operation power supply for detection, electrical insulation deterioration can be detected with high precision without being affected by stray capacitances of the motor and wiring cable.

Since the deterioration state of the electrical insulation resistance can be detected for a plurality of motors driven by a plurality of inverter circuits simply by using one electrical insulation deterioration detecting system, electrical insulation deterioration can be detected for the plurality of motors at lower cost.

In particular in the present invention, since some of the semiconductor switches included in the inverter circuit and put into conductive state are used to detect the electrical insulation deterioration, the number of components required for detection, such as a switch, can be reduced. If an alarm signal is detected when placing the plurality of semiconductor switches into a conductive state one by one in a predetermined sequence, it becomes possible to know not only a possibility of occurrence of deterioration in the electrical insulation resistance of a motor but also to know a possibility of electrical insulation deterioration in the excitation winding of the motor to which the semiconductor switch in the conductive state is connected, thereby identifying the cause of the electrical insulation deterioration.

DETAILED DESCRIPTION OF THE PREFERRED EMBODIMENTS

Figure 1:
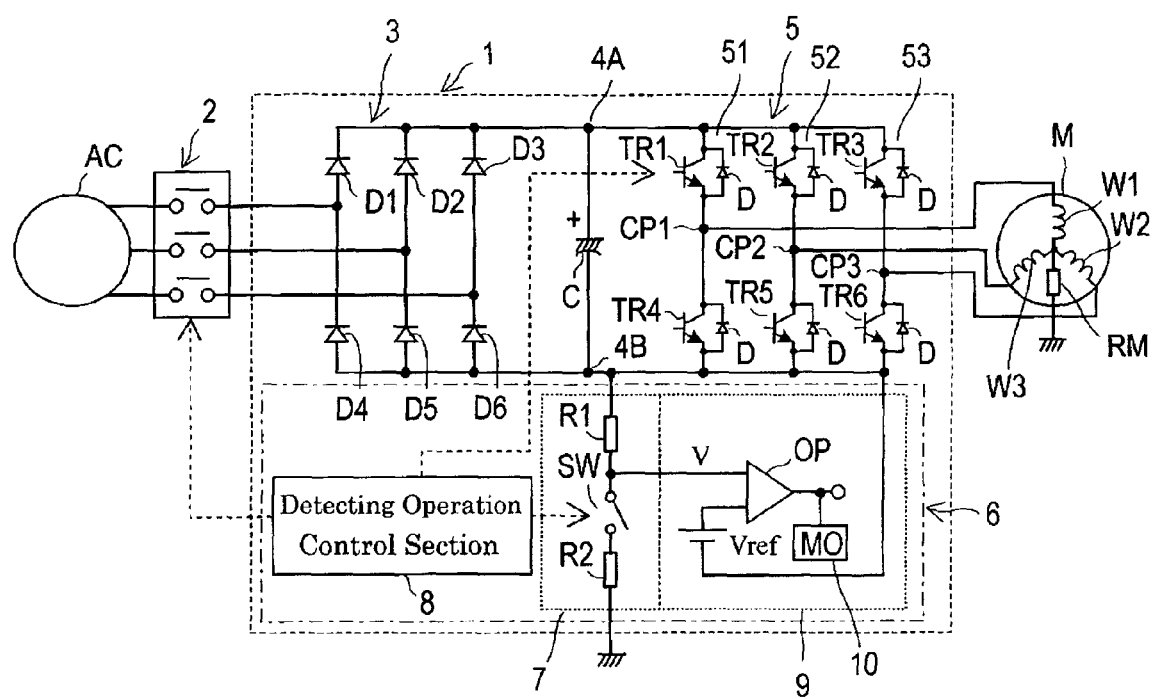
FIG. 1 is a circuit diagram showing an example configuration of a motor control system according to a first embodiment of the present invention, in which one inverter circuit drives one motor.

Embodiments of the present invention for carrying out a motor control system and a method of detecting electrical insulation deterioration of a motor will now be described in detail hereinbelow with reference to the accompanying drawings. FIG. 1 shows an example configuration of a motor control system 1, in which one three-phase motor M is driven by one inverter circuit 5. The motor control system 1 is connected to a three phase alternating current power supply AC through an electromagnetic contactor 2 that serves as a circuit breaker. In the motor control system 1, three phase alternating currents outputted from the three phase alternating current power supply AC are fully rectified through a full wave rectifier circuit 3, which is constituted from a bridge connection of the six diodes D1 to D6 so that a direct current voltage may be obtained. The direct current voltage is then smoothed by a smoothing capacitor C, which is constituted from an electrolytic capacitor. In the present embodiment, a rectifier circuit is constituted from the full wave rectifier circuit 3 and the smoothing capacitor C. Both ends of the smoothing capacitor C constitute a positive DC output portion 4A and a negative DC output portion 4B.

The inverter circuit 5 is constituted from a bridge circuit in which three arm circuits 51 to 53 are connected in parallel. Each of the three arm circuits 51 to 53 includes a pair of semiconductor switches connected in series (TR1 and TR4, TR2 and TR5, and TR3 and TR6), which are transistors. Each of the arm circuits also has an AC output portion at a connection point CP1 to CP3 of the pair of semiconductor switches (TR1 and TR4, TR2 and TR5, and TR3 and TR6). The connection points CP1 to CP3 are respectively connected to three phase excitation windings W1 to W3, which are star-connected. In FIG. 1, an electrical insulation resistance RM is illustrated between the neutral point of the star-connected three phase excitation windings W1-W3 and the ground. The resistance value of the electrical insulation resistance is gradually decreasing depending upon the progress of electrical insulation deterioration of the motor. Six diodes D are antiparallel-connected to the six transistors TR1 to TR6 used in the inverter circuit 5. In the present embodiment, the inverter circuit 5 is PWM-controlled based on a PWM control signal outputted from an inverter control circuit, not illustrated, to convert direct current power into AC power and output the converted AC power. The inverter control circuit detects a position of a rotor of the motor based on an output from a position transducer (not illustrated), such as an encoder fixed to an output axis of the motor, and controls the position and velocity of the rotor of the motor based on the detected data. The motor control system 1 includes an electrical insulation deterioration detecting system 6, which detects the electrical insulation deterioration (a considerable decrease in the electrical insulation resistance RM) of the motor M driven by the inverter circuit 5.

The electrical insulation deterioration detecting system 6 includes a voltage divider circuit 7, a detecting operation control section 8 and a voltage comparison section 9. The voltage divider circuit 7 is arranged between a negative DC output portion 4B and a ground, through a normally open switch circuit SW that consists of a relay contact. Specifically, the voltage divider circuit 7 is configured to have the normally open switch circuit SW between one end of a first resistor R1 that serves as resistance for detecting electrical insulation deterioration and one end of a second resistor R2. The other end of the first resistor R1 is electrically connected to the negative DC output portion 4B, and the other end of the second resistor R2 is electrically connected to the ground. The normally open switch circuit SW is normally opened, but it is closed when a command is inputted. A voltage across the first resistor R1 is inputted into a voltage comparator OP in the voltage comparison section 9 as a divided voltage. The second resistor R2 functions as a protective resistance having a resistance for preventing an overcurrent from flowing through the motor M when the motor M is ground faulted. With such voltage divider circuit 7 configured as described above, overcurrent can be prevented with certainty from flowing through the motor M even when the motor M is ground faulted.

The detecting operation control section 8 closes the normally open switch SW during which a circuit breaker comprising electromagnetic contactor is opened, and places at least one of the transistors TR1 to TR3 that are electrically connected to the positive DC output portion 4A into a conductive state, from among the six transistors TR1 to TR6 included in the three arm circuits 51 to 53.

In the present embodiment, a command to open the circuit breaker is outputted to the circuit breaker 2 from the detecting operation control section 8 upon detecting operation so as to open the circuit breaker 2. When the circuit breaker 2 is used as a power switch for stopping the control over the Motor M, which is operated by the motor control system 1, the circuit breaker 2 may be configured to be opened according to a command outputted from a stop switch.

The voltage comparison section 9 compares a divided voltage V outputted from the voltage divider circuit 7 and a reference voltage Vref with the voltage comparator OP. If it is determined by the voltage comparator OP that the divided voltage V exceeds the reference voltage Vref, the voltage comparison section 9 outputs an alarm signal indicating that the electrical insulation resistance RM has been decreased to a deterioration level, based on an output of the voltage comparator OP. A user using the motor control system 1 can replace the motor M based on information obtained from this alarm signal, thereby preventing a system failure when the motor is ground faulted.

To detect a deterioration state of the motor M including the electrical insulation deterioration of each excitation winding W1 to W3, the detecting operation control section 8 may cause the transistors TR1 to TR3 in a conductive state or place them into a conductive state one by one in a predetermined sequence. The voltage comparison section 9 compares the divided voltage V outputted from the voltage divider circuit 7 and the reference voltage Vref. If it is determined by the voltage comparison section 9 that the divided voltage V exceeds the reference voltage Vref, an alarm signal is outputted. The outputted alarm signal indicates a possibility of occurrence of deterioration in the electrical insulation resistance of the motor M, or electrical insulation deterioration in an excitation winding of the motor M to which the semiconductor switch in the conductive state (any one of TR1 to TR3) is connected. Specifically, for example, a plurality of display lamps are disposed on a display unit. The possibility of occurrence of electrical insulation deterioration in the motor can be indicated by turning on one of the lamps according to the outputted alarm signal, and the possibility of occurrence of electrical insulation deterioration in an excitation winding corresponding to a transistor in the conductive state can be indicated by turning on another one of the lamps to specify the transistor now in the conductive state. Which transistor is now in the conductive state can be identified more easily by confirming that which transistor has received a conduction signal outputted from the detecting operation control section 8. It is detectable in one operation whether the electrical insulation deterioration of the motor is attributed to a considerable decrease of the electrical insulation resistance, or to the electrical insulation deterioration of a specific excitation winding, based on the output of an alarm signal when the transistors TR1 to TR3 are placed into a conductive state one by one. Namely, if the alarm signal is outputted each time the transistors TR1 to TR3 are placed into the conductive state, it is assumed that the electrical insulation deterioration is due to the considerable decrease of the electrical insulation resistance. However, if the alarm signal is outputted only when a certain transistor is placed into a conductive state, the electrical insulation deterioration is very likely to occur in one of the excitation windings corresponding to the certain transistor. If the detecting operation control section 8 and the voltage comparison section 9 are implemented using a microcomputer, the microcomputer should determine whether there is a possibility of occurrence of electrical insulation deterioration in the electrical insulation resistance of the motor or in the excitation windings, based on the conduction timing of the transistors TR1 to TR3 and data on whether or not the alarm signal is outputted in each conduction timing. How to indicate the determination result is arbitrary.

In the present embodiment, the electrical insulation deterioration detecting system 6 further comprises a comparison result storage section (MO) 10 that stores a comparison result obtained by the voltage comparison section 9, with respect to the voltage comparison section 9. The comparison result storage section 10 stores historical data on the past comparison results. Even when placing the transistors TR1 to TR3 into the conductive state one by one in the predetermined sequence as mentioned above to detect the deterioration state of the motor M, the comparison result storage section 10 sequentially stores the comparison result at the time that the transistors are in the conductive state. With such configuration, it is correctly determined whether the above-mentioned electrical insulation deterioration has occurred in the motor or in the excitation windings, by checking the data stored in the comparison result storage section 10. It also becomes possible to observe the electrical insulation state of the excitation windings W1 to W3 corresponding to the transistors TR1 to TR3 by checking the data stored in the comparison result storage section 10. To observe the progress of the electrical insulation deterioration, it is desirable to provide two or more kinds or levels of reference voltages as the reference voltage "Vref". By comparing the divided voltage V with the reference voltages Vref, it is possible to perceive a sign of progressing deterioration in electrical insulation before finally determining that the electrical insulation deterioration has occurred.

When the resistance value of the electrical insulation resistance RM of the motor is defined as "RM", the resistance value of the first resistor R1 is defined as "R1", and the voltage across the smoothing capacitor C is defined as "VDC", the voltage across the first resistor R1 or the divided voltage V is detected as $V=VDC/(RM+R1+R2)R1$. When the electrical insulation resistance value "RM" is high, the divided voltage V is low. When the electrical insulation resistance value "RM" is low, the divided voltage V is high. Accordingly, deterioration of the electrical insulation resistance RM can be detected by setting up the reference voltage Vref corresponding to a level of the divided voltage at the time that the electrical insulation resistance RM deteriorates or decreases to a certain degree. The setting of the reference voltage Vref is defined arbitrarily according to the type or using condition of the motor. In the embodiment of FIG. 1, the reference voltage Vref is determined using the voltage across the smoothing capacitor C.

In the embodiment of FIG. 1, when detecting the electrical insulation deterioration of the motor, a usual motor control operation is stopped and the circuit breaker 2 is turned OFF or opened. The normally open switch circuit SW is closed (turned ON), and the negative DC input portion for the inverter circuit 5 or the negative DC output portion 4B for the rectifier circuit 3 is grounded through the first resistor R1 and the second resistor R2. Then, at least one of the transistors TR1 to TR3 located near the positive electrode of the three arms 51 to 53 of the inverter circuit 5 are placed into the conductive state. In this manner, the voltage across the smoothing capacitor C is applied to a series circuit, from any one of the transistors TR1 to TR3 in the conductive state through windings of the motor M, the electrical insulation resistance RM, and the second resistor R2, to the first resistance R1. When the voltage comparator OP compares the divided voltage V across the first resistor R1 with the reference voltage Vref and it is determined that the divided voltage V is larger than (exceeds) the reference voltage Vref, it turns out that the electrical insulation deterioration (a considerable decrease of the electrical insulation resistance or electrical insulation deterioration of a certain excitation winding) has occurred.

Instead of the voltage comparison section OP disposed in the electrical insulation deterioration detecting system 6, the divided voltage V may be digitized with AD converter and inputted into a microprocessor so that the electrical insulation deterioration can be detected through software processing within the microprocessor. It can be easily detected that the electrical insulation deterioration is now in progress. The rectifier circuit 3 may be a circuit that can regenerate electric power to the power supply AC, such as PWM converter. In this configuration, the PWM converter is stopped upon detecting the electrical insulation deterioration.

A control source necessary for operating the electrical insulation deterioration detecting system 6 is provided separately from the three phase alternating current power supply AC to which the circuit breaker 2 is connected. Alternatively, the control source may be connected directly to the three phase alternating current power supply AC, not through the circuit breaker 2.

The present invention can also be applied even when a plurality of inverter circuits are connected to the rectifier circuit. In this configuration, the detecting operation control section may be configured to close the normally open switch circuit during which the circuit breaker is opened, sequentially select one inverter circuit to be detected, from among the plurality of inverter circuits, and place at least one of the semiconductor switches included in the plurality of arm circuits in the selected inverter circuit and electrically connected to the other of the positive DC output portion and the negative DC output portion into a conductive state, while the circuit breaker is opened. With such configuration, deterioration of the electrical insulation resistance of the plurality of motors driven by the plurality of inverter circuits can be detected in order by using one electrical insulation deterioration detecting system. As a result, electrical insulation deterioration is detectable for the plurality of motors at lower cost.

Figure 2:
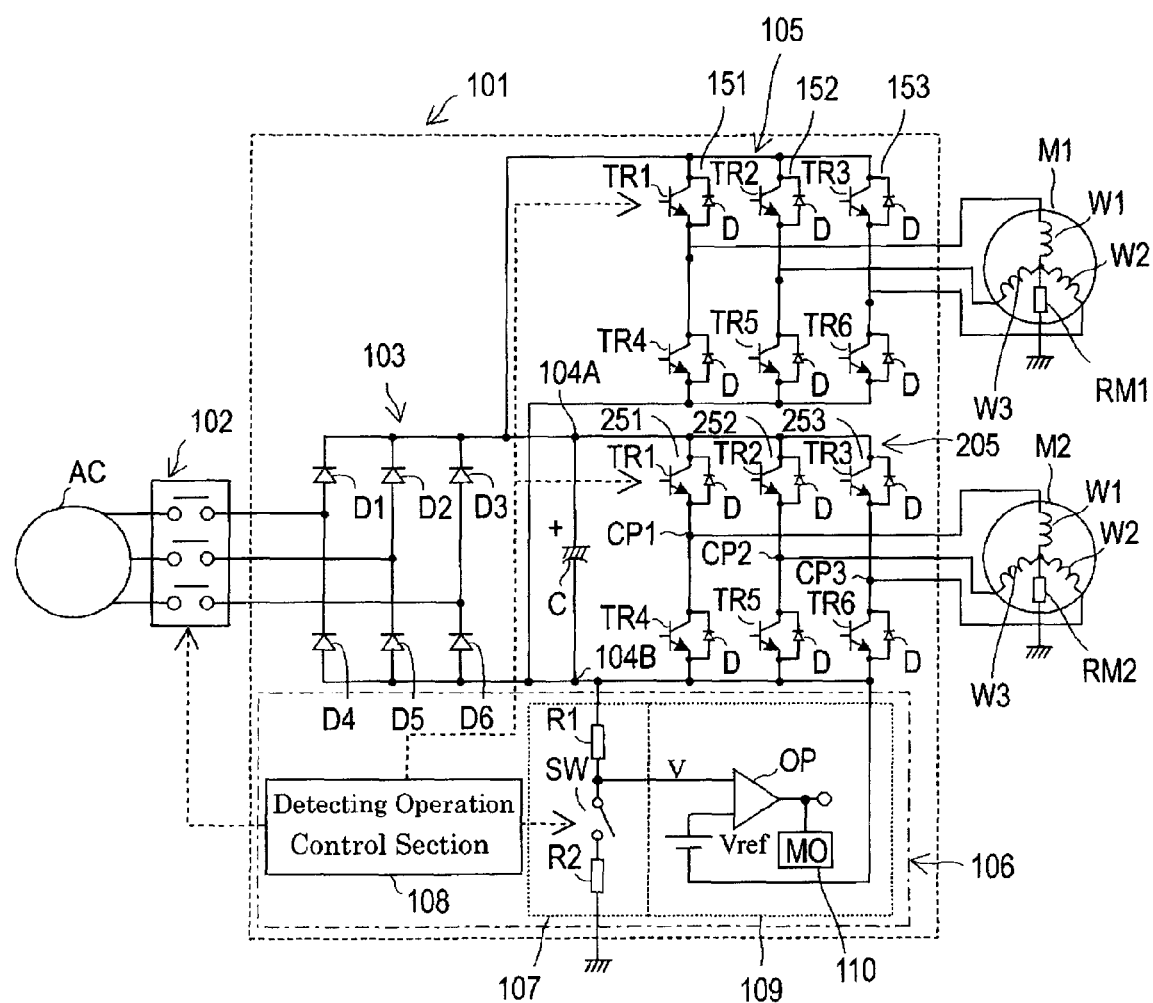
FIG. 2 is a circuit diagram showing an example configuration of a motor control system according to a second embodiment of the present invention, in which two inverter circuits drive two motors.

FIG. 2 shows a circuit diagram of a motor control system according to a second embodiment of the present invention. In FIG. 2, components similar to those constituting the circuit diagram shown in FIG. 1 have their reference numerals calculated by adding a number 100 or number 200 to the corresponding reference numerals indicated in FIG. 1, and their detailed descriptions will be omitted. In the embodiment of FIG. 2, two inverter circuits 105 and 205 are connected to a rectifier circuit 103. The inverter circuits 105 and 205 are connected to motors M1 and M2 respectively. In the present embodiment, the electrical insulation deterioration for the two motors can be detected by using one electrical insulation deterioration detecting system 106. Accordingly, in the present embodiment, a detecting operation control section 108 of the electrical insulation deterioration detecting system 106 closes a normally open switch circuit SW during which a circuit breaker 102 is opened, and sequentially selects one inverter circuit to be detected, from among the two inverter circuits 105 and 205, and places at least one transistor electrically connected to a positive DC output portion 104 into a conductive state, among six transistors TR1 to TR6 included in arm circuits (151 to 153, or 251 to 253) in the selected inverter circuit. Specifically, at least one or more of the transistors TR1 to TR3 that are included in the arms 151-153 of the inverter circuit 105 and that are connected to the positive DC output portion 104A are placed into the conductive state. A divided voltage V across a first resistor R1 in a voltage divider circuit 107 is compared with a reference voltage Vref by a voltage comparator OP of a voltage comparison section 109, and if the divided voltage V exceeds the reference voltage Vref, the occurrence of electrical insulation deterioration of the motor M1 has been detected. Next, the detecting operation control section 108 stops output of a conduction signal to a certain transistor in the inverter circuit 105, and starts to supply the conduction signal to a certain transistor in the inverter circuit 205. Also in this configuration, at least one or more of the transistors TR1 to TR3 that are included in arms 251-253 of the inverter circuit 205 and that are connected to the positive DC output portion 104A are placed into the conductive state. The divided voltage V across the first resistor R1 in the voltage divider circuit 107 is compared with the reference voltage Vref by the voltage comparator OP of the voltage comparison section 109, and if the divided voltage V exceeds the reference voltage Vref, the occurrence of electrical insulation deterioration of the motor M2 has been detected.

In this manner, if detection of the electrical insulation deterioration is sequentially repeated for the plurality of motors, for example, after completing the detection for one motor, another detection is repeated in a similar manner for another inverter circuit corresponding to the other motor as described above, detection can be done at a lower cost.

In the embodiment of FIG. 2, to detect electrical insulation deterioration of the motors M1 and M2 including the excitation windings W1 to W3 of the respective motors, the detecting operation control section 108 may be configured to place the transistors TR1 to TR3 into the conductive state one by one in a predetermined sequence. In this configuration, when it is determined by the voltage comparison section 109 that the divided voltage V exceeds the reference voltage Vref, an alarm signal is outputted indicating a possibility of occurrence of deterioration in the electrical insulation resistance of the motor M1 or M2, and/or a possibility of occurrence of electrical insulation deterioration in the excitation winding of the motor to which the semiconductor switch in the conductive state (any one of TR1 to TR3) is connected.

Figure 3:
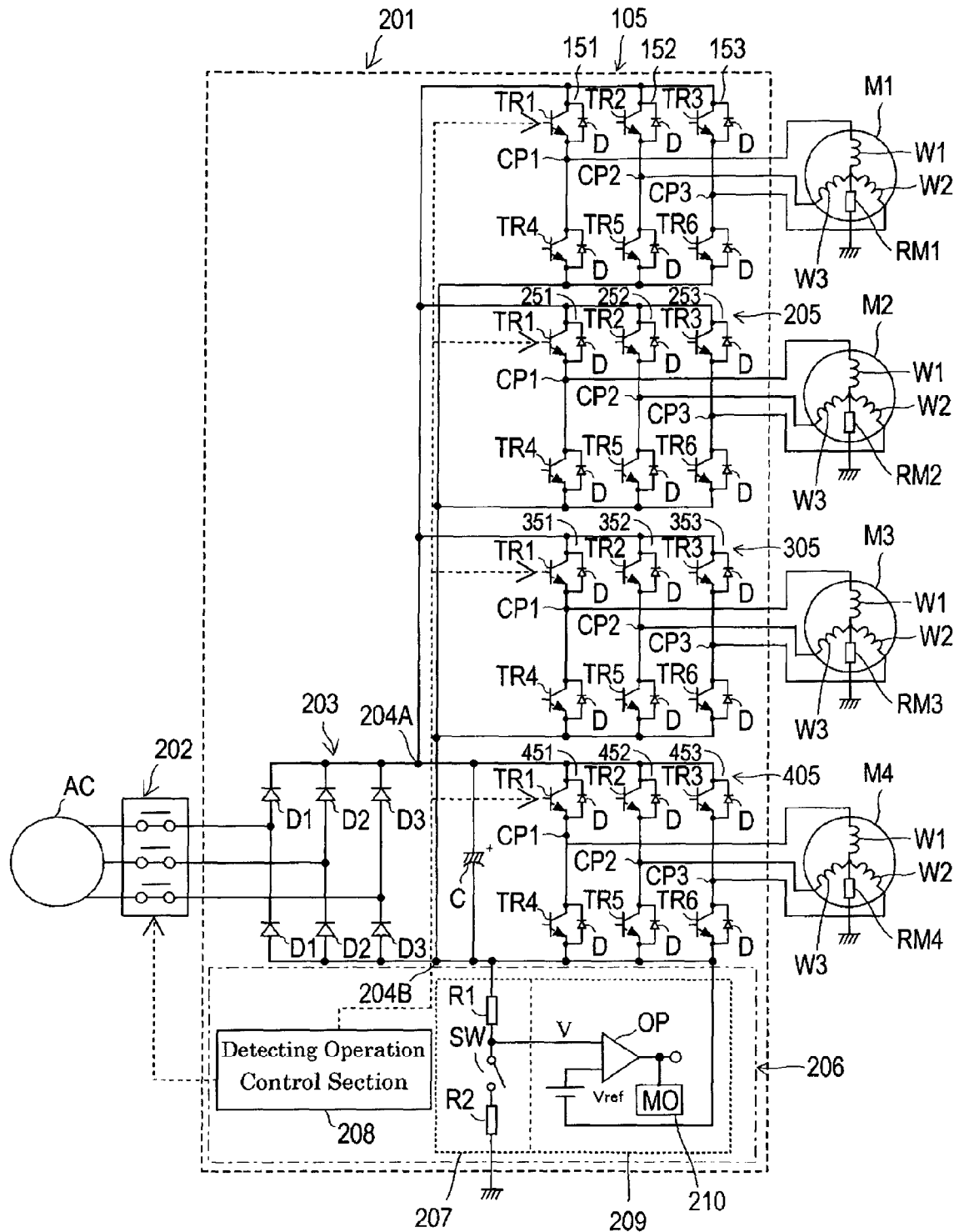
FIG. 3 is a circuit diagram showing an example configuration of a motor control system according to a third embodiment of the present invention, in which four inverter circuits drive four motors.

FIG. 3 shows a circuit diagram of a motor control system according to a third embodiment of the present invention. In FIG. 3, components similar to those constituting the circuit diagram shown in FIG. 1 have their reference numerals calculated by adding a number 100 to 400 to the corresponding reference numerals indicated in FIG. 1, and their detailed descriptions will be omitted. In the embodiment of FIG. 3, four inverter circuits 105, 205, 305 and 405 are connected to a rectifier circuit 203. The four inverter circuits 105 to 405 are respectively connected to four motors M1 to M4. In the present embodiment, electrical insulation deterioration in each of the four motors can be detected using one electrical insulation deterioration detecting system 206, as with the embodiment of FIG. 2. To detect the electrical insulation deterioration of motors one by one, a detecting operation control section 208 of the electrical insulation deterioration detecting system 206 closes a normally open switch circuit SW during which a circuit breaker 202 is opened, sequentially selects an inverter circuit to be detected from among the four inverter circuits 105 to 405 one by one, and places at least one transistor (TR1 to TR3) electrically connected to a positive DC output portion 204A into a conductive state, from among the six transistors TR1 to TR6 included in arm circuits (151 to 153, 251 to 253, 351 to 353, and 451 to 453) in the selected inverter circuit, while the circuit breaker 202 is opened. As with the first and second embodiments, to detect the electrical insulation deterioration of the motors M1 to M4 including the excitation windings W1 to W3 of respective motors, the detecting operation control section 208 may be configured to put the transistors TR1 to TR3 into a conductive state one by one in a predetermined sequence.

Specifically, at least one or more of the transistors TR1 to TR3 that are included in the arms 151 to 153 of the inverter circuit 105 and that are connected to the positive DC output portion are placed into the conductive state. The voltage comparator OP of a voltage comparison section 209 compares the divided voltage V across the resistor R1 in a voltage divider circuit 207 with the reference voltage Vref. If it is determined that the divided voltage V exceeds the reference voltage Vref, the voltage comparison section OP outputs an alarm signal indicating a possibility of occurrence of electrical insulation deterioration in the motor M1 and/or a possibility of occurrence of electrical insulation deterioration in the excitation winding corresponding to the transistor in the conductive state. Next, the detecting operation control section 208 stops output of the conduction signal to the certain transistor in the inverter circuit 105, and starts to supply the conduction signal to a certain transistor in the inverter circuit 205. Also in this configuration, deterioration is detected by placing at least one or more of the transistors TR1 to TR3 that are included in the arms 251 to 253 of the inverter circuit 205 and electrically connected to the positive DC output portion into the conductive state. Similarly, as for inverter circuits 305 and 405, electrical insulation deterioration is detected as with the inverter circuits 105 and 205.

Instead of selecting the inverter circuits one by one as described above, the detecting operation control section 208 may be configured to select two or more groups of inverter circuits together so as to detect the electrical insulation deterioration of two or more groups of motors at a time. For example, two inverter circuits 105 and 205 are selected from among the four inverter circuits 105 to 405 as a first group. Then, at least one or more semiconductor switches are selected from among the semiconductor switches TR1 to TR3, which are included in the selected two inverter circuits 105 and 205 and electrically connected to the positive DC output portion 204A, and placed into the conductive state.

Alternatively, the switches TR1 to TR3 are placed into the conductive state one by one in a predetermined sequence. If the same conduction control of the semiconductor switches TR1 to TR3 is given to both of the selected two inverter circuits 105 and 205 at a time, the conduction control of semiconductor switches included in the respective inverter circuits becomes simpler. However, the timing of the conduction control given to the semiconductor switches may be of course different from each other between the two inverter circuits. Next, the other two inverter circuits 305 and 405 (second group) are selected. Then, at least one or more semiconductor switches are selected from among the semiconductor switches TR1 to TR3, which are included in the other two inverter circuits 305 and 405 (second group) and electrically connected to the positive DC output portion 204A, and placed into conductive state. Alternatively, the switches TR1 to TR3 may be put into conductive state one by one in a predetermined sequence. Even in this configuration, the same conduction control of the semiconductor switches TR1 to TR3 is given to both of the selected two inverter circuits 305 and 405 at a time. Even in this configuration, the timing of the conduction control given to the semiconductor switches may be of course different from each other between the two inverter circuits 305 and 405.

According to the present embodiment, the electrical insulation deterioration of motors can be detected sequentially by dealing with the selected two inverter circuits as one group. If the number of the inverter circuits selected at a time is always the same, configuration of the detecting operation control section 208 can be simplified. In this situation, upon detecting a plurality of inverter circuits as one group at a time, it is detectable that there is a possibility of occurrence of electrical insulation deterioration in one of the motors within the group. However, it is impossible to identify a motor in which the electrical insulation deterioration has occurred. Even in this case, an appropriate countermeasure is available using the publicly known ways as far as it can be identified which group the motor of the electrical insulation deterioration belongs to.

If the number of the inverter circuit installed in the motor control system is not divided by equal numbers, for example by five, the number of the inverter circuit in a first group and the number of the inverter circuit in a second group may differ. Namely, detection may be performed for the first group consisting of three inverter circuits at first, and subsequently performed for the second group consisting of two inverter circuits.

Description of how to drive a plurality of motors using a plurality of inverter circuits is generalized as follows. Namely, when driving m motors with m inverter circuits respectively, the detecting operation control section is configured to close the normally open switch circuit at first while the circuit breaker is opened, then to select n (n is a positive integer from one to less than m) inverter circuits to be detected from among the m inverter circuits sequentially, and to place at least one of the semiconductor switches, which is included in the plurality of arm circuits in the selected n inverter circuits and electrically connected to the other of the positive DC output portion and the negative DC output portion, into conductive state, or place the semiconductor switches into a conductive state one by one in a predetermined sequence. The voltage comparison section compares the divided voltage outputted from the voltage divider circuit with the reference voltage. If it is determined by the voltage comparison section that the divided voltage exceeds the reference voltage, the voltage comparison section outputs an alarm signal.

According to the above-mentioned embodiments, the electrical insulation deterioration of the motors M and M1 to M4 is detected when the normal operation of motors is stopped and the circuit breakers 2, 102 and 202 are opened so as to turn off the three phase alternating current power supply AC. Accordingly, influence of leakage current flowing through a line of the power supply or noise from the power supply can be prevented upon detection. In addition, since the insulation deterioration is detected using the first resistor R1, which is electrically connected only at the time of the detecting operation, the first resistor R1 can serve as a dedicated electrical insulation deterioration detection resistor having a dedicated resistance value. Moreover, since the electrical insulation deterioration is detected by flowing a direct current through a certain transistor in the inverter circuits using a direct current voltage applied across the input portions of the inverter circuits 5 and 105 to 405 (voltage across the capacitor C), electrical insulation deterioration can be detected with high precision without being affected by stray capacitances of a motor and wiring cable. Further, even if the motor is ground faulted, excessive current flow can be prevented since the second resistor R2 serves as a protective resistance. Accordingly, in the above-mentioned embodiments, it is not necessary to remove wiring of the motor and accordingly no special operation is needed.

In the above three embodiments, although divided voltage resistance circuits 7, 107 and 207 are connected to negative DC output portions 4B, 104B and 204B upon detecting the electrical insulation deterioration, it is also possible to connect the divided voltage resistance circuits 7, 107 and 207 to positive DC output portions 4A, 104A and 204A. In this configuration, when detecting the electrical insulation deterioration, it is only necessary to place at least one or more of the transistors TR4 to TR6, which are connected to the negative DC output portion, into the conductive state, or place the transistors TR4 to TR6 into the conductive state one by one sequentially, from among the six transistors TR1 to TR6 included in the three arms 51 to 53 in the inverter circuit 5, for example. This may apply to the second and third embodiments.

While certain features of the invention have been described with reference to example embodiments, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A motor control system comprising:
    a rectifier circuit that is connected to an AC power supply through a circuit breaker and that includes a positive DC output portion, a negative DC output portion and a smoothing capacitor connected across the positive DC output portion and the negative DC output portion;
    an inverter circuit that is constituted from a plurality of arm circuits connected in parallel, each arm circuit including a pair of semiconductor switches connected in series and having an AC output portion at a connection point of the pair of semiconductor switches; and
    an electrical insulation deterioration detecting system that detects deterioration in electrical insulation resistance of a motor driven by the inverter circuit,
    the electrical insulation deterioration detecting system comprising:
        a voltage divider circuit that is arranged between one of the positive DC output portion and the negative DC output portion and a ground through a normally open switch circuit;
        a detecting operation control section that closes the normally open switch circuit and causes at least one of the semiconductor switches included in the plurality of arm circuits and electrically connected to the other of the positive DC output portion and the negative DC output portion to be in a conductive state, while the circuit breaker is opened; and
        a voltage comparison section that compares a divided voltage outputted from the voltage divider circuit and a reference voltage to determine if the divided voltage exceeds the reference voltage, and outputs an alarm signal indicating a possibility of occurrence of deterioration in the electrical insulation resistance if the divided voltage exceeds the reference voltage.

2. The motor control system according to claim 1,
    wherein the detecting operation control section causes the semiconductor switches, which are included in the plurality of arm circuits and electrically connected to the other of the positive DC output portion and the negative DC output portion, to be in a conductive state one by one in a predetermined sequence, while the circuit breaker is opened; and
    wherein the voltage comparison section outputs the alarm signal indicating a possibility of occurrence of deterioration in the electrical insulation resistance of the motor, and/or a possibility of occurrence of electrical insulation deterioration in an excitation winding of the motor to which the semiconductor switch in the conductive state is connected, if the divided voltage exceeds the reference voltage.

3. The motor control system according to claim 1,
    wherein the voltage divider circuit comprises a first resistor having one end and the other end and a second resistor having one end and the other end; the one end of the first resistor is electrically connected to the negative DC output portion; the one end of the second resistor is electrically connected to the ground; and the other end of the first resistor is electrically connected to the other end of the second resistor; and
    wherein a voltage across the first resistor is inputted to the voltage comparison section as the divided voltage, and the second resistor serves as a protective resistance that prevents a possibility of occurrence of overcurrent when the motor is ground faulted.

4. The motor control system according to claim 1,
    wherein the electrical insulation deterioration detecting system further comprises a comparison result storage section that stores a comparison result obtained by the voltage comparison section.

5. A motor control system comprising:
    a rectifier circuit that is connected to an AC power supply through a circuit breaker and that includes a positive DC output portion, a negative DC output portion and a smoothing capacitor connected across the positive DC output portion and the negative DC output portion;
    a plurality of inverter circuits each of which is constituted from a plurality of arm circuits connected in parallel, each arm circuit including a pair of semiconductor switches connected in series and having an AC output portion at a connection point of the pair of semiconductor switches; and
    an electrical insulation deterioration detecting system that detects deterioration in electrical insulation resistance of a plurality of motors driven by the inverter circuits,
    the electrical insulation deterioration detecting system comprising:

a voltage divider circuit that is arranged between one of the positive DC output portion and the negative DC output portion and a ground through a normally open switch circuit;

a detecting operation control section that closes the normally open switch circuit, sequentially selects an inverter circuit to be detected one after another from among the plurality of inverter circuits, and causes at least one of the semiconductor switches, which are included in the plurality of arm circuits in the selected inverter circuit and electrically connected to the other of the positive DC output portion and the negative DC output portion, to be in a conductive state, while the circuit breaker is opened; and a voltage comparison section that compares a divided voltage outputted from the voltage divider circuit and a reference voltage and outputs an alarm signal indicating a possibility of occurrence of deterioration in the electrical insulation resistance if the divided voltage exceeds the reference voltage.

6. The motor control system according to claim 5,
wherein the voltage divider circuit comprises a first resistor having one end and the other end and a second resistor having one end and the other end; the one end of the first resistor is electrically connected to the negative DC output portion; the one end of the second resistor is electrically connected to the ground; and the other end of the first resistor is electrically connected to the other end of the second resistor; and
wherein a voltage across the first resistor is inputted to the voltage comparison section as the divided voltage, and the second resistor serves as a protective resistance that prevents a possibility of occurrence of overcurrent if the motor is ground faulted.

7. The motor control system according to claim 5,
wherein the electrical insulation deterioration detecting system further comprises a comparison result storage section that stores a comparison result obtained by the voltage comparison section.

8. A motor control system comprising:
a rectifier circuit that is connected to an AC power supply through a circuit breaker and that includes a positive DC output portion, a negative DC output portion and a smoothing capacitor connected across the positive DC output portion and the negative DC output portion;
m (m is a positive integer of two or more) inverter circuits each of which is constituted from a plurality of arm circuits connected in parallel, each arm circuit including a pair of semiconductor switches connected in series and having an AC output portion at a connection point of the pair of semiconductor switches; and an electrical insulation deterioration detecting system that detects deterioration in electrical insulation resistance of the m motors driven by the m inverter circuits respectively, the electrical insulation deterioration detecting system comprising:
a voltage divider circuit that is arranged between one of the positive DC output portion and the negative DC output portion and a ground through a normally open switch circuit;

a detecting operation control section that closes the normally open switch circuit, sequentially selects n (n is a positive integer from one to less than m) inverter circuits to be detected, and causes the semiconductor switches, which are included in the plurality of arm circuits included in the selected n inverter circuits and electrically connected to the other of the positive DC output portion and the negative DC output portion, to be in a conductive state one by one in a predetermined sequence, while the circuit breaker is opened; and a voltage comparison section that compares a divided voltage outputted from the voltage divider circuit and a reference voltage and outputs an alarm signal indicating a possibility of occurrence of deterioration in the electrical insulation resistance of any of the n motors driven by the selected n inverter circuits, and/or a possibility of occurrence of electrical insulation deterioration in an excitation winding of the motor to which the semiconductor switch in the conductive state is connected, if the divided voltage exceeds the reference voltage.

9. The motor control system according to claim 8,
wherein the voltage divider circuit comprises a first resistor having one end and the other end and a second resistor having one end and the other end; the one end of the first resistor is electrically connected to the negative DC output portion; the one end of the second resistor is electrically connected to the ground; and the other end of the first resistor is electrically connected to the other end of the second resistor; and
a voltage across the first resistor is inputted to the voltage comparison section as the divided voltage, and the second resistor serves as a protective resistance that prevents a possibility of occurrence of overcurrent if the motor is ground faulted.

10. The motor control system according to claim 8, wherein the electrical insulation deterioration detecting system further comprises a comparison result storage section that stores a comparison result obtained by the voltage comparison section.

* * * * *